(12) United States Patent
Morita et al.

(10) Patent No.: US 12,283,452 B2
(45) Date of Patent: Apr. 22, 2025

(54) CHARGED PARTICLE BEAM APPARATUS

(71) Applicant: Hitachi High-Tech Corporation, Tokyo (JP)

(72) Inventors: Hiroshi Morita, Tokyo (JP); Takashi Kubo, Tokyo (JP); Minoru Sakamaki, Tokyo (JP); Shuhei Ishikawa, Tokyo (JP); Shunichi Watanabe, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 18/285,457

(22) PCT Filed: Apr. 15, 2021

(86) PCT No.: PCT/JP2021/015638
§ 371 (c)(1),
(2) Date: Oct. 3, 2023

(87) PCT Pub. No.: WO2022/219790
PCT Pub. Date: Oct. 20, 2022

(65) Prior Publication Data
US 2025/0079112 A1    Mar. 6, 2025

(51) Int. Cl.
*H01J 37/07* (2006.01)
*H01J 37/09* (2006.01)
(Continued)

(52) U.S. Cl.
CPC .............. *H01J 37/07* (2013.01); *H01J 37/09* (2013.01); *H01J 37/16* (2013.01); *H01J 37/241* (2013.01);
(Continued)

(58) Field of Classification Search
CPC ............ H01J 37/07; H01J 37/09; H01J 37/16
See application file for complete search history.

(56) References Cited

U.S. PATENT DOCUMENTS

2024/0170248 A1* 5/2024 Podhola ................ H01J 29/563

FOREIGN PATENT DOCUMENTS

| JP | 52-79758 A | 7/1977 |
| JP | 55-68096 A | 5/1980 |

(Continued)

OTHER PUBLICATIONS

Japanese-language Office Action issued in Japanese Application No. 2023-514287 dated Feb. 13, 2024 with English translation (6 pages).

(Continued)

*Primary Examiner* — Joseph L Williams
(74) *Attorney, Agent, or Firm* — Crowell & Moring LLP

(57) ABSTRACT

Provided is a charged particle beam apparatus capable of realizing a highly reliable insulating structure. This charged particle beam apparatus emits a charged particle beam from a charged particle beam emission device onto a sample, detects charged particles generated from the sample, and creates a sample image or processes the sample. The charged particle beam emission device is provided with a charged particle source and a shield arranged in an interior of a metal housing that is filled with an insulating gas, and an acceleration electrode arranged below the charged particle source, power being supplied to the acceleration electrode via the shield.

12 Claims, 6 Drawing Sheets

(51) Int. Cl.
*H01J 37/16* (2006.01)
*H01J 37/24* (2006.01)
*H01J 37/295* (2006.01)

(52) U.S. Cl.
CPC ... *H01J 37/2955* (2013.01); *H01J 2237/0473* (2013.01)

(56) References Cited

FOREIGN PATENT DOCUMENTS

| | | |
|---|---|---|
| JP | 59-48738 U | 3/1984 |
| JP | 61-99958 U | 6/1986 |
| JP | 61-153999 A | 7/1986 |
| JP | 2014-127296 A | 7/2014 |

OTHER PUBLICATIONS

International Search Report (PCT/ISA/210) issued in PCT Application No. PCT/JP2021/015638 dated Jun. 22, 2021 with English translation (4 pages).

Japanese-language Written Opinion (PCT/ISA/237) issued in PCT Application No. PCT/JP2021/015638 dated Jun. 22, 2021 with English translation (6 pages).

\* cited by examiner

[FIG. 1]
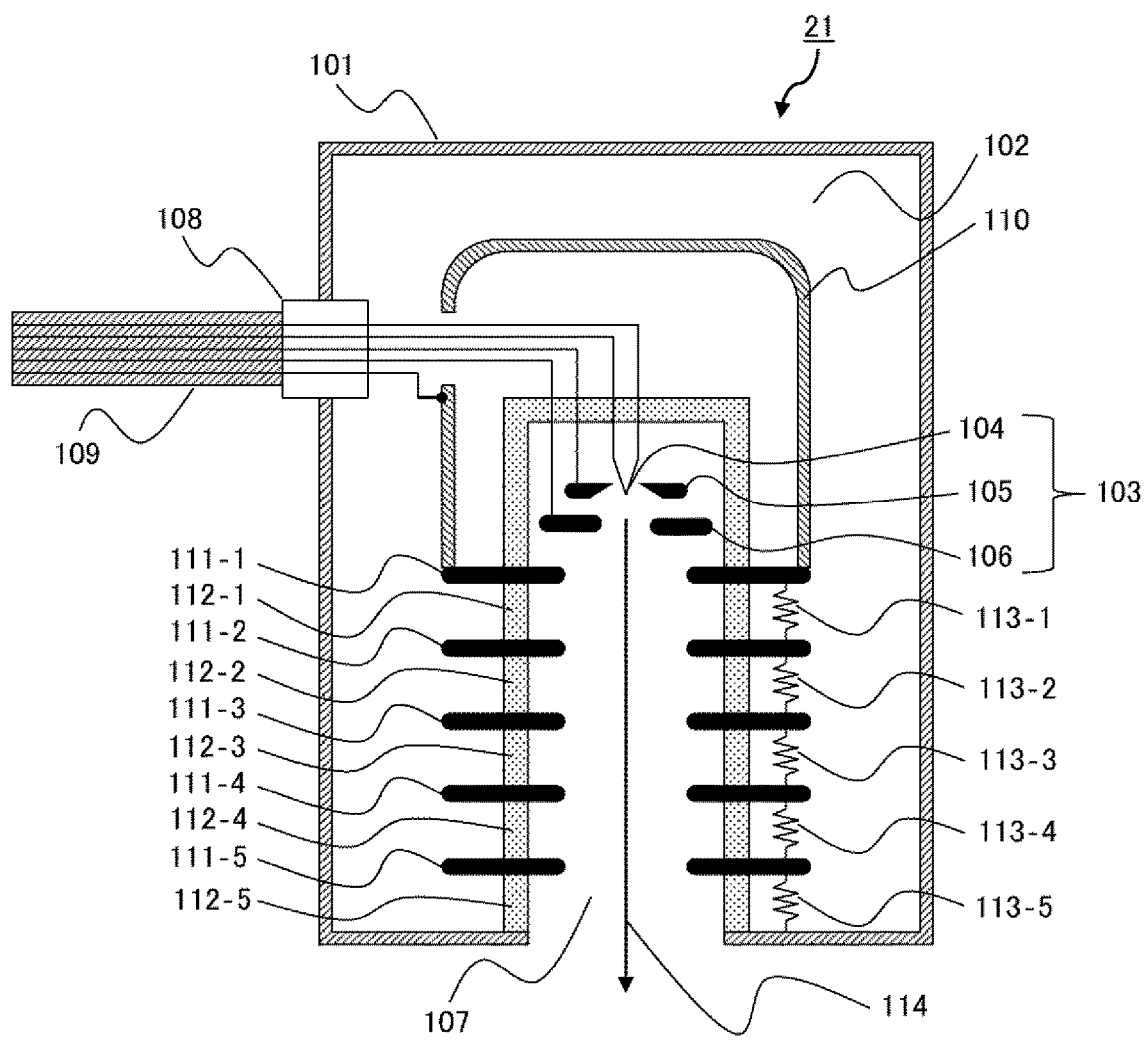

[FIG. 2]
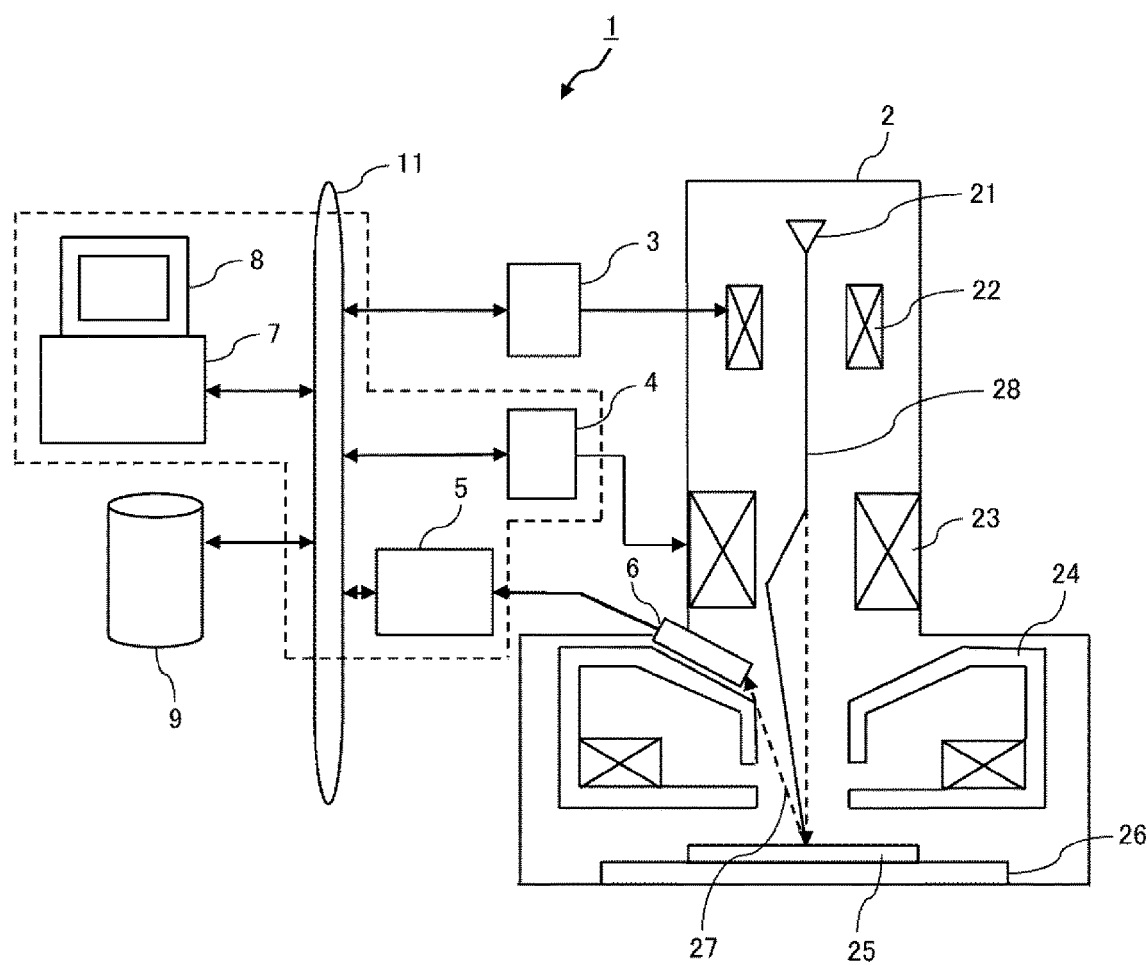

[FIG. 3]
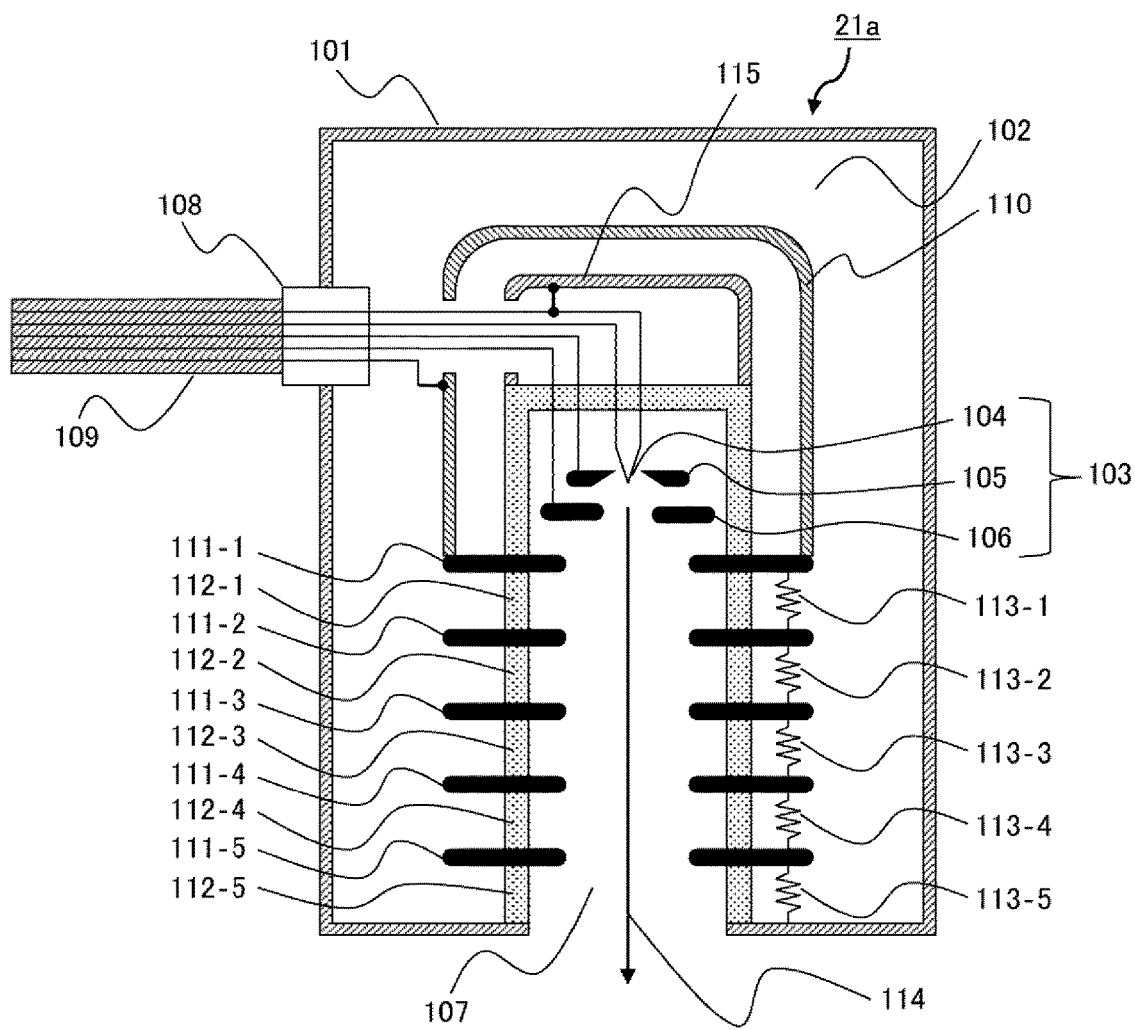

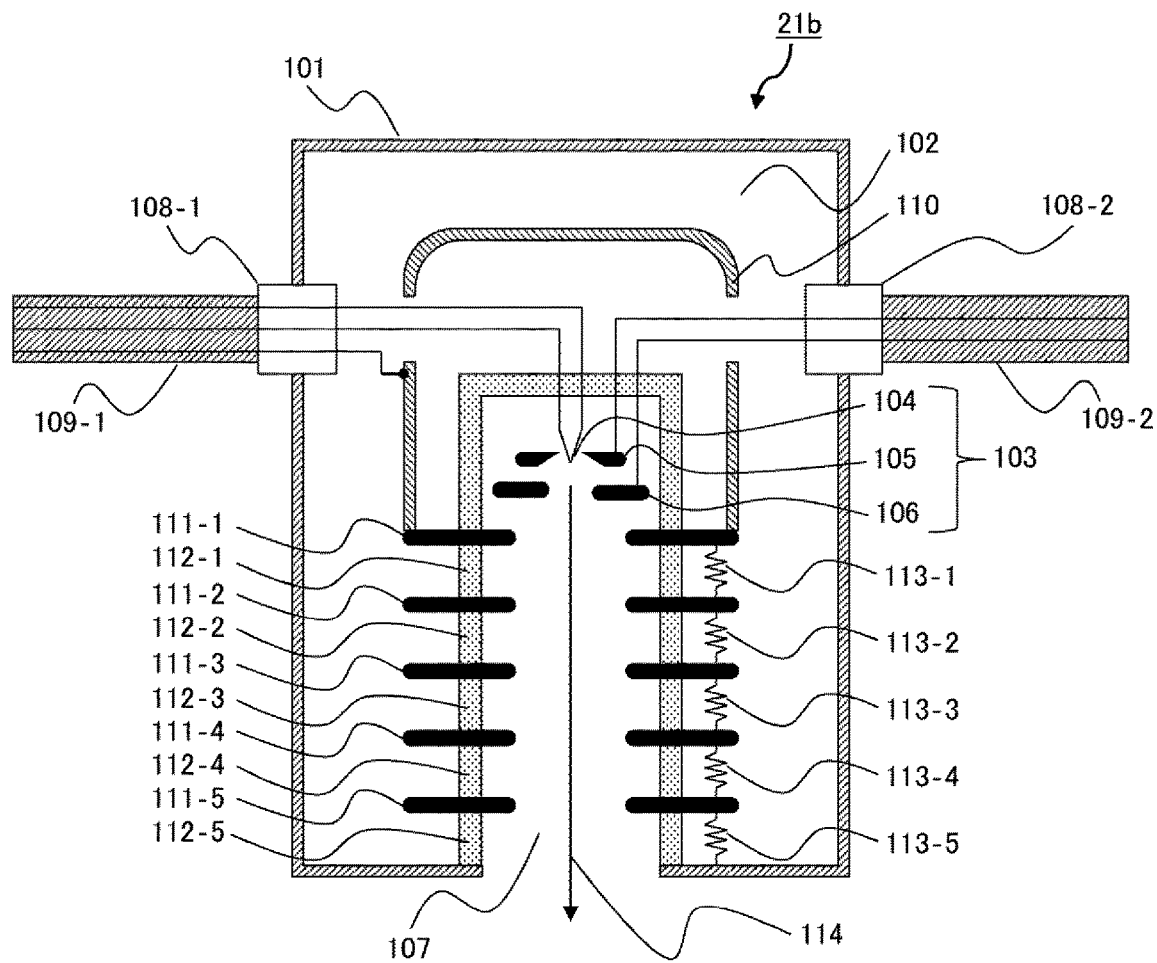
[FIG. 4]

[FIG. 5]
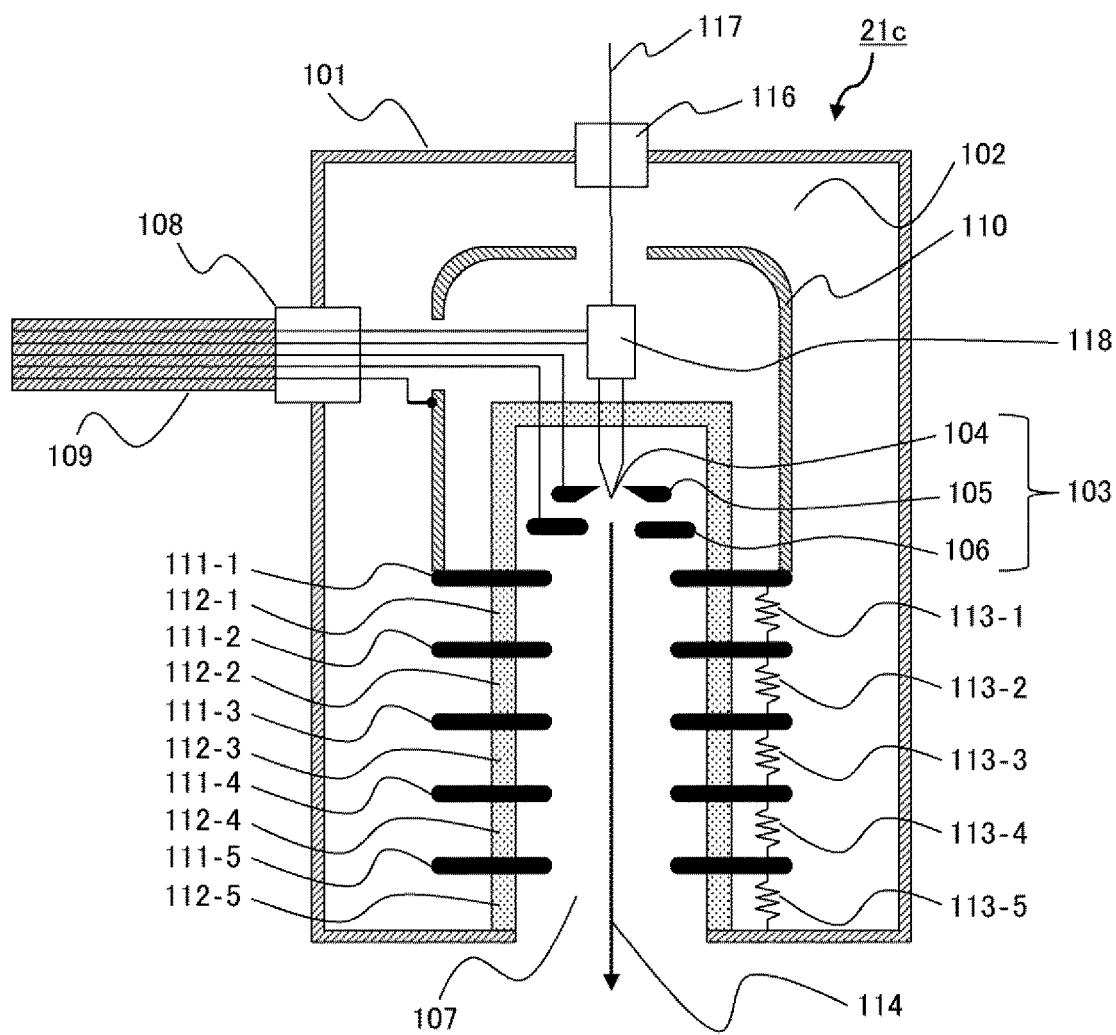

[FIG. 6]
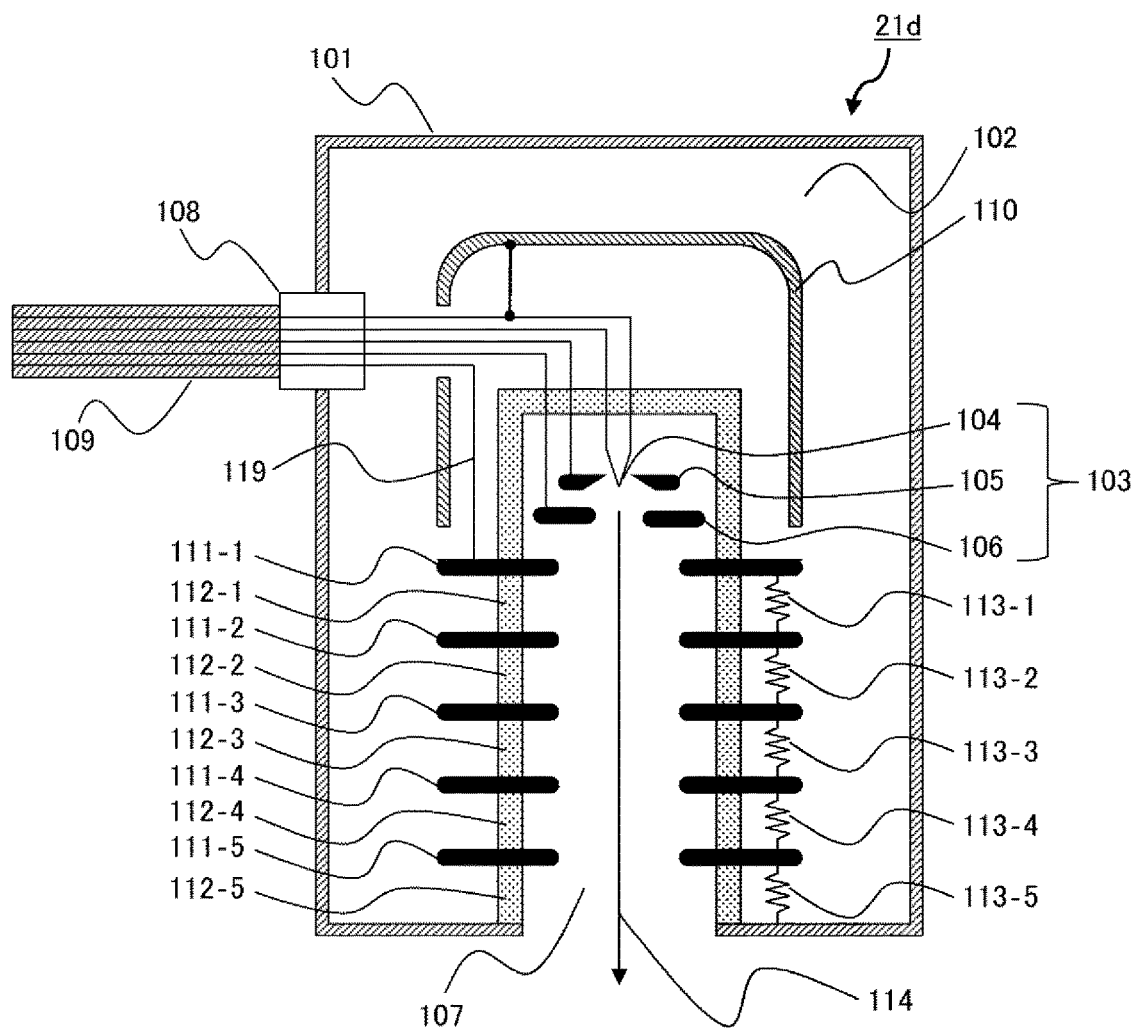

CHARGED PARTICLE BEAM APPARATUS

TECHNICAL FIELD

The present invention relates to a charged particle beam apparatus and more particularly to a charged particle beam apparatus having a highly reliable charged particle beam emission device.

BACKGROUND ART

In general, an electron beam emission device for an electron microscope is largely divided into a device that emits an electron beam generated from an electron gun onto the sample, and a device that emits the electron beam generated from the electron gun that is further accelerated by an accelerating tube onto the sample. The former is mainly applied to a scanning electron microscope that does not require large electron energy, and the latter is mainly applied to a transmission electron microscope that requires large electron energy.

Since the transmission electron microscope uses a high voltage of 100 kV or more, a highly reliable insulating structure that does not cause dielectric breakdown is required.

Examples of the electron beam emission device using the accelerating tube include an electron gun disclosed in PTL 1. In PTL 1, cooling of the electron gun is achieved by circulating insulating gas in a highly reliable insulating structure having a shield in an insulating gas space.

Structurally, the electron gun has protrusions, and an electric field is high at tips of the protrusions, and thus the dielectric breakdown due to discharge may occur. However, since the electron gun is surrounded with a high-potential shield as described above, the electric field at the tips of the protrusions can be relaxed, and the dielectric breakdown due to discharge can be suppressed.

Each electrode or acceleration electrode of the electron gun is required to be set to a different potential. In PTL 1, a multicore bushing referred to as a cable head introduces a current from the atmosphere into the insulating gas, and a voltage is applied to each electrode or acceleration electrode via a wiring in the insulating gas.

CITATION LIST

Patent Literature

PTL 1: JPS52-79758A

SUMMARY OF INVENTION

Technical Problem

However, in the configuration disclosed in PTL 1, there is a concern that a high-potential wiring may discharge electricity between the wirings or between insulating gas containers at the ground potential to cause dielectric breakdown.

Therefore, the invention provides a charged particle beam apparatus capable of realizing a highly reliable insulating structure.

Solution to Problem

In order to solve the above problems, a charged particle beam apparatus according to the invention emits a charged particle beam from a charged particle beam emission device onto a sample, detects a charged particle generated from the sample, and creates a sample image or processes the sample, the charged particle beam emission device includes: a charged particle source and a shield that are arranged in an interior of a metal housing that is filled with an insulating gas; and an acceleration electrode arranged below the charged particle source, and power is supplied to the acceleration electrode via the shield.

Also, a charged particle beam apparatus according to the invention emits a charged particle beam from a charged particle beam emission device onto a sample, detects a charged particle generated from the sample, and creates a sample image or processes the sample, the charged particle beam emission device includes: a charged particle source and a shield that are arranged in an interior of a metal housing that is filled with an insulating gas; and an acceleration electrode arranged below the charged particle source, a potential of the shield is the same as that in any portion of the charged particle source, and power is supplied to the acceleration electrode by an accelerating tube power supply wiring arranged inside the shield.

Advantageous Effects of Invention

According to the invention, it is possible to provide a charged particle beam apparatus that can realize a highly reliable insulating structure.

Problems, configurations, and effects other than those described above are clarified by the following description of the embodiments.

BRIEF DESCRIPTION OF DRAWINGS

FIG. 1 is a vertical cross-sectional view of an electron beam emission device of Example 1 according to an example of the invention.

FIG. 2 is an overall configuration diagram of a charged particle beam apparatus according to an embodiment of the invention.

FIG. 3 is a vertical cross-sectional view of an electron beam emission device of Example 2 according to another example of the invention.

FIG. 4 is a vertical cross-sectional view of an electron beam emission device of Example 3 according to another example of the invention.

FIG. 5 is a vertical cross-sectional view of an electron beam emission device of Example 4 according to another example of the invention.

FIG. 6 is a vertical cross-sectional view of an electron beam emission device of Example 5 according to another example of the invention.

DESCRIPTION OF EMBODIMENTS

Hereinafter, as a charged particle beam apparatus of the invention, a scanning electron microscope (SEM) that detects a secondary electron generated from a sample by emitting primary electron rays onto the sample and two-dimensionally scanning to form an image is exemplified. Note that the charged particle beam apparatus of the invention is not limited to the scanning electron microscope and includes a transmission electron microscope (TEM), a scanning ion microscope (SIM), a focused ion beam (FIB) processing device, and the like.

FIG. 2 is an overall configuration diagram of a charged particle beam apparatus according to an embodiment of the invention. A scanning electron microscope (SEM) 1 as a charged particle beam apparatus according to the present example includes an electron beam emission device 21 that emits a primary electron, a focusing lens 22 for focusing the primary electron emitted from the electron beam emission device 21 onto a surface of a sample 25 on a sample holding unit 26, a deflector 23 that deflects a focused primary electron ray 28 onto the sample 25 in a two-dimensionally scannable manner, an objective lens 24, and a secondary electron detector 6 that detects a secondary electron 27 that is generated from the sample 25 by the emission of the primary electron ray 28, in a housing 2 that maintains a vacuum state by an evacuation system (not illustrated).

The scanning electron microscope 1 also includes a focusing lens control unit 3 that controls a voltage applied to the focusing lens 22, a deflection control unit 4 that controls the deflector 23 based on the deflection value of the primary electron ray 28 supplied as the command value from a control device 7, and a detection signal processing unit 5 that creates image data based on a signal from the secondary electron detector 6. Here, the secondary electron detector 6 is configured with a phosphor that emits light upon collision with the secondary electron 27 generated from the sample 25, and a photomultiplier tube that converts an optical signal into an electrical signal and amplifies the electrical signal. In addition, a semiconductor detector or the like may be used as the secondary electron detector 6. Also, the detection signal processing unit 5 includes an amplifier that amplifies the electric signal from the photomultiplier tube (not illustrated), an A/D converter that converts the amplified electric signal into a digital signal, and an image forming unit that calculates the brightness of each pixel based on the digital signal from the A/D converter, a deflection value output from the deflection control unit 4 to the deflector 23, and a scanning timing, and creates image data.

Further, the scanning electron microscope 1 includes the control device 7 that is connected to the focusing lens control unit 3, the deflection control unit 4, the detection signal processing unit 5, and an external storage medium 9 via a bus 11, and a display device 8. The external storage medium 9 can store the image data or pattern shape information (such as CAD data) created by the detection signal processing unit 5.

Hereinafter, as an example of the charged particle beam apparatus, with respect to details of the electron beam emission device as the charged particle beam emission device that configures the electron microscope, examples are described with reference to the drawings.

Also, an electron gun is described as an example of a charged particle source, and an electron gun shield is described as an example of a charged particle source shield. Also, an electron gun control device is described as an example of a charged particle source control device.

Example 1

FIG. 1 is a vertical cross-sectional view of an electron beam emission device of Example 1 according to an example of the invention.

As illustrated in FIG. 1, the electron beam emission device 21 is configured with a metal housing 101 filled with an insulating gas 102, an electron gun 103 and shields 112 arranged inside the metal housing 101, n acceleration electrodes 111-1 to 111-$n$ arranged under the electron gun 103, insulating materials 112-1 to 112-$n$ that insulate between the acceleration electrodes, resistors 113 to n that electrically connect the acceleration electrodes to each other, a multicore cable 109, and a bushing 108.

The metal housing 101 may partially use a non-metallic member, but an inner surface is desirably made of metal or a conductive material.

The insulating gas 102 includes sulfur hexafluoride, nitrogen, carbon dioxide, air, or various compounds containing carbon and fluorine.

In the electron gun 103 that configures the electron beam emission device 21, an electron source 104, a suppressor electrode 105, and an extraction electrode 106 are arranged in vacuum 107. The n acceleration electrodes 111-1 to 111-$n$, the insulating materials 112-1 to 112-$n$ that insulate between the acceleration electrodes, and the resistors 113 to ns that electrically connect the acceleration electrodes to each other are provided under the electron gun 103.

A high voltage is introduced into the metal housing 101 via the multicore cable 109 and the bushing 108 connected to an external high voltage generation device (not illustrated), and power is applied to the electron source 104, the suppressor electrode 105, and the extraction electrode 106 of the electron gun 103, and the shield 110 via a wiring in the insulating gas 102. Here, the shield 110 is made of a conductive member, for example, a metal material.

The shield 110 is electrically connected to the acceleration electrode 111-1, and power is supplied to the acceleration electrode 111-1 via the shield 110.

In the configuration described above, an electron beam 114 can be generated by causing potentials of the above units to satisfy the electron source 104<the extraction electrode 106<the acceleration electrode 111-1 . . . the acceleration electrode 111-$n$.

The inner surface of the shield 110 and/or the metal housing 101 may be coated with an insulating coating material. It is desirable that the volume resistivity of the insulating coating material is $10^{12}$ Ωcm or more.

In addition, it is desirable to add, to the coating material, non-linear resistance materials having electric field dependency of a resistivity such as zinc oxide, silicon carbide, and barium titanate, which can improve insulation reliability due to the effect of relaxing the electric field when foreign matter adheres.

The electron microscope is configured by using the electron beam emission device 21 having the above configuration.

With the above configuration, by using the shield 110 for power supply from the bushing 108 to the acceleration electrode 111-1, a dedicated high-potential wiring is not required, and there is no reduction in the insulation reliability due to electric field concentration in the wiring.

Furthermore, the insulation reliability is improved due to the effect of the insulating coating material, and thus a highly reliable insulation structure that does not cause dielectric breakdown can be realized.

As described above, according to the present embodiment, it is possible to provide the charged particle beam apparatus that can realize a highly reliable insulating structure.

Further, according to the present example, since a shield having the same potential as that of the acceleration electrode is provided in the insulating gas space between the electron gun and the housing, the shield is used for power supply from the bushing to the acceleration electrode, the dedicated high-potential wiring is not required, and there is no reduction in the insulation reliability due to the electric field concentration in the wiring, and thus a highly reliable insulating structure that does not cause the dielectric breakdown can be realized.

Example 2

FIG. 3 is a vertical cross-sectional view of an electron beam emission device of Example 2 according to another example of the invention. An electron beam emission device 21a according to the present example includes an electron gun shield 115 between the shield 110 and the electron gun 103 in addition to the above-described configuration of Example 1. The other configurations are the same as those in Example 1 described above, the same components as in Example 1 are denoted by the same reference numerals, and the description overlapping with that of Example 1 is omitted below.

The electron gun shield 115 illustrated in FIG. 3 is electrically connected to and at the same potential as any portion of the electron gun 103. In FIG. 3, the configuration having the same potential as the electron source 104 is illustrated, but the example is not limited thereto. For example, the electron gun shield 115 may be electrically connected to and at the same potential as the suppressor electrode 105, the extraction electrode 106, or another electrode included in the electron gun.

Similarly to Example 1 described above, the inner surface of the shield 110, and the metal housing 101 and/or the electron gun shield 115 may be coated with an insulating coating material. The insulating coating material described in Example 1 described above may be applied.

An electron microscope is configured by using the electron beam emission device 21a of the above configuration.

With the above configuration, by providing the electron gun shield 115 having the same potential as any portion of the electron gun 103 between the shield 110 and the electron gun 103 having the same potential as the acceleration electrode 111-1, there is no reduction in the insulation reliability due to the electric field concentration in the wiring or the terminal, and thus it is possible to realize a highly reliable insulating structure that does not cause the dielectric breakdown between the electron gun and the shield having the same potential as the acceleration electrode.

According to the present example, in addition to the effect of Example 1, by providing a shield having the same potential as any portion of the electron gun between the shield having the same potential as the acceleration electrode and the electron gun, there is no reduction in the insulation reliability due to the electric field concentration in the wiring or the terminal. Therefore, it is possible to provide a charged particle beam apparatus that can realize a highly reliable insulating structure that does not cause the dielectric breakdown between the electron gun and the shield having the same potential as the acceleration electrode.

Example 3

FIG. 4 is a vertical cross-sectional view of an electron beam emission device of Example 3 according to another example of the invention. An electron beam emission device 21b according to the present example is different from Example 1 in that the plurality of bushings 108 and the plurality of multicore cables 109 are provided. The other configurations are the same as those of Example 1 described above, the same components as in Example 1 are denoted by the same reference numerals, and the description overlapping with that of Example 1 is omitted below.

As illustrated in FIG. 4, the electron beam emission device 21b includes the bushing 108-1, the multicore cable 109-1, the bushing 108-2, and the multicore cable 109-2 in the electron beam emission device 21 of Example 1 described above.

In FIG. 4, the bushing 108-1 and the multicore cable 109-1 are arranged on the opposite side of the bushing 108-2 and the multicore cable 109-2 with respect to the central axis. In other words, the bushing 108-1 and the multicore cable 109-1 are arranged to face the bushing 108-2 and the multicore cable 109-2. Note that the arrangement of the bushing 108-1, the multicore cable 109-1, the bushing 108-2, and the multicore cable 109-2 is not limited thereto. For example, the bushing 108-1, the multicore cable 109-1, the bushing 108-2, and the multicore cable 109-2 may be arranged above the metal housing 101.

Note that, in FIG. 4, in the electron beam emission device 21 of Example 1, the configuration including the bushing 108-1, the multicore cable 109-1, the bushing 108-2, and the multicore cable 109-2 is described, but the example is not limited thereto. The electron beam emission device 21a of Example 2 may include the bushing 108-1, the multicore cable 109-1, the bushing 108-2, and the multicore cable 109-2.

An electron microscope is configured by using the electron beam emission device 21b having the above configuration.

With the above configuration, a highly reliable insulating structure can be realized similarly to Examples 1 and 2, and also a more highly reliable insulating structure can be realized, since the multicore cable 109 having a smaller number of cores and the bushing 108 can be used, and a wiring having a high potential can be arranged with a sufficient distance.

According to the present example, in addition to the effects of Examples 1 and 2, since a multicore cable having a smaller number of cores and a bushing can be used, and the wiring having a high potential can be arranged with a sufficient distance, it is possible to provide a charged particle beam apparatus that can realize a more highly reliable insulating structure.

Example 4

FIG. 5 is a vertical cross-sectional view of an electron beam emission device of Example 4 according to another example of the invention. An electron beam emission device 21c according to the present example is different from Example 1 in that a control wiring 117, a current introduction terminal 116, and an electron gun control device 118 are provided. The other configurations are the same as those of Example 1 described above, the same components as in Example 1 are denoted by the same reference numerals, and the description overlapping with that of Example 1 is omitted below.

As illustrated in FIG. 5, the electron beam emission device 21c further includes the control wiring 117, the current introduction terminal 116, and the electron gun control device 118 in the electron beam emission device 21 of Example 1 described above. Note that it is preferable to include one or more control wirings 117 and one or more current introduction terminals 116. The control wiring 117 may be an electric wire or may be an optical cable.

The control wiring 117 is connected to the electron gun control device 118 via an opening provided in the shield 110 and transmits a signal for controlling an ON/OFF state or the like of a voltage and/or a current of the electron gun 103.

Note that, in FIG. 4, in the electron beam emission device 21 of Example 1, the configuration including the control wiring 117, the current introduction terminal 116, and the electron gun control device 118 is provided, but the example is not limited thereto. For example, in the electron beam emission device 21a of Example 2 or the electron beam emission device 21b of Example 3, the control wiring 117, the current introduction terminal 116, and the electron gun control device 118 may be further provided.

An electron microscope is configured by using the electron beam emission device 21c having the above configuration.

With the above configuration, a highly reliable insulating structure can be realized similarly to Examples 1, 2, and 3, and also it is possible to realize the control of an ON/OFF state or the like of a voltage and/or a current of the electron gun 103.

Example 5

FIG. 6 is a vertical cross-sectional view of an electron beam emission device of Example 5 according to another example of the invention. The electron beam emission device 21d according to the present example is different from Example 1 in that a potential of the shield 110 is not the same as the potential of the acceleration electrode 111-1, but the potential of the shield 110 is the same potential as any potential of the electron gun 113. The other configurations are the same as those of Example 1 described above, the same components as in Example 1 are denoted by the same reference numerals, and the description overlapping with that of Example 1 is omitted below.

As illustrated in FIG. 6, in the electron beam emission device 21d according to the present example, since the potential of the shield 110 is not the same potential as the acceleration electrode 111-1 but any potential of the electron gun 113, the shield 110 is not electrically connected to the acceleration electrode 111-1 but is electrically connected to any of the electron gun 113.

The power is supplied to the acceleration electrode 111-1 by an accelerating tube power supply wiring 119 arranged inside the shield 110 via the multicore cable 109 and the bushing 108.

The accelerating tube power supply wiring 119 is insulated by having a sufficient distance from the shield 110 or arranging an insulating material. The accelerating tube power supply wiring 119 may be provided through the inside of the vacuum 107.

Note that, as illustrated in FIG. 5, since the potential of the shield 110 is not the same potential of the acceleration electrode 111-1 but any potential of the electron gun 113, the configuration in which the shield 110 is not electrically connected to the acceleration electrode 111-1 but is electrically connected to any of the electron gun 113 and the configuration in which power is supplied to the acceleration electrode 111-1 by the accelerating tube power supply wiring 119 can be applied to the electron beam emission device 21a of Example 2, the electron beam emission device 21b of Example 3, and the electron beam emission device 21c of Example 4.

An electron microscope is configured by using the electron beam emission device 21d having the above configuration.

With the above configuration, it is possible to realize a highly reliable insulating structure similarly to Examples 2, 3, or 4.

According to the present example, it is possible to provide a charged particle beam apparatus that can realize a highly reliable insulating structure similarly to Examples 2 to 4.

Note that the invention is not limited to the above examples but includes various modifications. For example, the examples described above have been described in detail for better understanding of the invention and are not necessarily limited to those having all the described configurations. Also, a portion of the configuration of one example can be replaced with the configuration of another example, and also the configuration of another example can be added to the configuration of one example.

REFERENCE SIGNS LIST

1: charged particle beam apparatus
2: housing
3: focusing lens control unit
4: deflection control unit
5: detection signal processing unit
6: secondary electron detector
7: control device
8: display device
9: external storage medium
10: recipe creation unit
12: image memory
21, 21a, 21b, 21c, 21d: electron beam emission device
22: focusing lens
23: deflector
24: objective lens
25: sample
26: sample holding unit
31: write address control unit
32: read address control unit
33: display control unit
101: metal housing
102: insulating gas
103: electron gun
104: electron source
105: suppressor electrode
106: extraction electrode
107: vacuum
108: bushing
109: multicore cable
110: shield
111: acceleration electrode
112: insulation body
113: resistor
114: electron beam
115: electron gun shield
116: current introduction terminal
117: control wiring
118: electron gun control device
119: accelerating tube power supply wiring

The invention claimed is:

1. A charged particle beam apparatus that emits a charged particle beam from a charged particle beam emission device onto a sample, detects a charged particle generated from the sample, and creates a sample image or processes the sample, the charged particle beam emission device comprising:
    a charged particle source and a shield that are arranged in an interior of a metal housing that is filled with an insulating gas; and
    an acceleration electrode arranged below the charged particle source, wherein
    power is supplied to the acceleration electrode via the shield.

2. The charged particle beam apparatus according to claim 1, comprising a charged particle source shield having the same potential as any portion of the charged particle source in an insulating gas space between the shield and the charged particle source.

3. The charged particle beam apparatus according to claim 1, comprising:
a first multicore cable and a first bushing; and
a second multicore cable and a second bushing, wherein
the first multicore cable and the first bushing are arranged at positions different from the second multicore cable and the second bushing, power is supplied to the acceleration electrode via the first multicore cable and the first bushing, and electrical connection to any portion of the charged particle source is made via the second multicore cable and the second bushing.

4. The charged particle beam apparatus according to claim 1, comprising:
one or more control wirings and a current introduction terminal; and
a charged particle source control device that is connected to the control wiring via an opening provided in the shield, wherein
the charged particle source control device controls an ON/OFF state of a voltage and/or a current of the charged particle source.

5. The charged particle beam apparatus according to claim 1, wherein an inner surface of the shield and/or the metal housing is coated to have an insulating property.

6. The charged particle beam apparatus according to claim 2, wherein an inner surface of at least of the shield, the metal housing, and the charged particle source shield is coated to have an insulating property.

7. The charged particle beam apparatus according to claim 3, wherein an inner surface of the shield and/or the metal housing is coated to have an insulating property.

8. The charged particle beam apparatus according to claim 4, wherein an inner surface of the shield and/or the metal housing is coated to have an insulating property.

9. The charged particle beam apparatus according to claim 2, comprising:
a first multicore cable and a first bushing; and
a second multicore cable and a second bushing, wherein
the first multicore cable and the first bushing are arranged at positions different from the second multicore cable and the second bushing, power is supplied to the acceleration electrode via the first multicore cable and the first bushing, and electrical connection to any portion of the charged particle source is made via the second multicore cable and the second bushing.

10. The charged particle beam apparatus according to claim 2, comprising:
one or more control wirings and a current introduction terminal; and
a charged particle source control device that is connected to the control wiring via an opening provided in the shield, wherein
the charged particle source control device controls an ON/OFF state of a voltage and/or a current of the charged particle source.

11. The charged particle beam apparatus according to claim 3, comprising:
one or more control wirings and a current introduction terminal; and
a charged particle source control device that is connected to the control wiring via an opening provided in the shield, wherein
the charged particle source control device controls an ON/OFF state of a voltage and/or a current of the charged particle source.

12. A charged particle beam apparatus that emits a charged particle beam from a charged particle beam emission device onto a sample, detects a charged particle generated from the sample, and creates a sample image or processes the sample, the charged particle beam emission device comprising:
a charged particle source and a shield that are arranged in an interior of a metal housing that is filled with an insulating gas; and
an acceleration electrode arranged below the charged particle source, wherein
a potential of the shield is the same as that in any portion of the charged particle source, and
power is supplied to the acceleration electrode by an accelerating tube power supply wiring arranged inside the shield.

* * * * *